(12) United States Patent
Kroener

(10) Patent No.: US 8,072,042 B1
(45) Date of Patent: Dec. 6, 2011

(54) INTEGRATED INDUCTOR AND METHOD FOR MANUFACTURING AN INTEGRATED INDUCTOR

(75) Inventor: Friedrich Kroener, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 12/949,849

(22) Filed: Nov. 19, 2010

(51) Int. Cl.
  *H01L 27/08* (2006.01)
  *H01L 21/20* (2006.01)
(52) U.S. Cl. .......... 257/531; 257/E21.022; 438/381
(58) Field of Classification Search .......... 438/381; 257/531, E21.022
  See application file for complete search history.

(56) References Cited

U.S. PATENT DOCUMENTS

2011/0073987 A1* 3/2011 Mackh et al. .......... 257/531

OTHER PUBLICATIONS

Ralph Steiner Banha et al., "Trench-Hall Devices", Journal of Microelectromechanical Systems, vol., 9, IEEE,, Mar. 2000, pp. 82-87.*

* cited by examiner

*Primary Examiner* — William D Coleman
(74) *Attorney, Agent, or Firm* — Coats & Bennett, P.L.L.C.

(57) ABSTRACT

A method for integrating an inductor into a semiconductor substrate is provided. The method includes providing a semiconductor substrate having a first surface and a second surface and forming at least a first trench and at least two openings in the semiconductor substrate. The first trench and the openings extend from the first surface into the semiconductor substrate, and the first trench has a ring-like shape. A portion of the first trench is arranged between the two openings. The method further includes depositing a magnetically soft material into the first trench to form a ring-like closed magnetisable core structure, depositing a conductive material into the openings to form vias, and forming an electrical cross-connection between the vias.

25 Claims, 12 Drawing Sheets

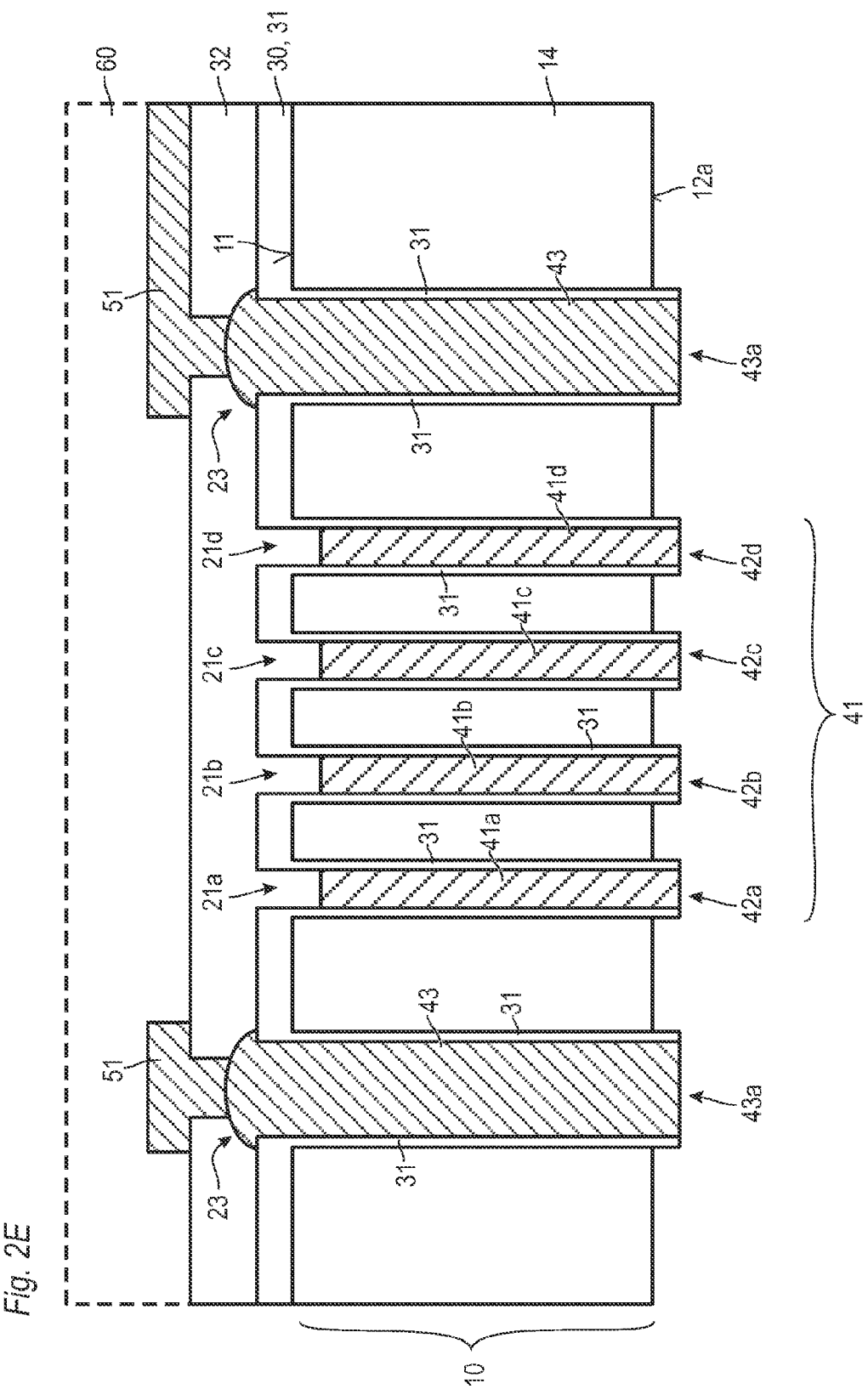

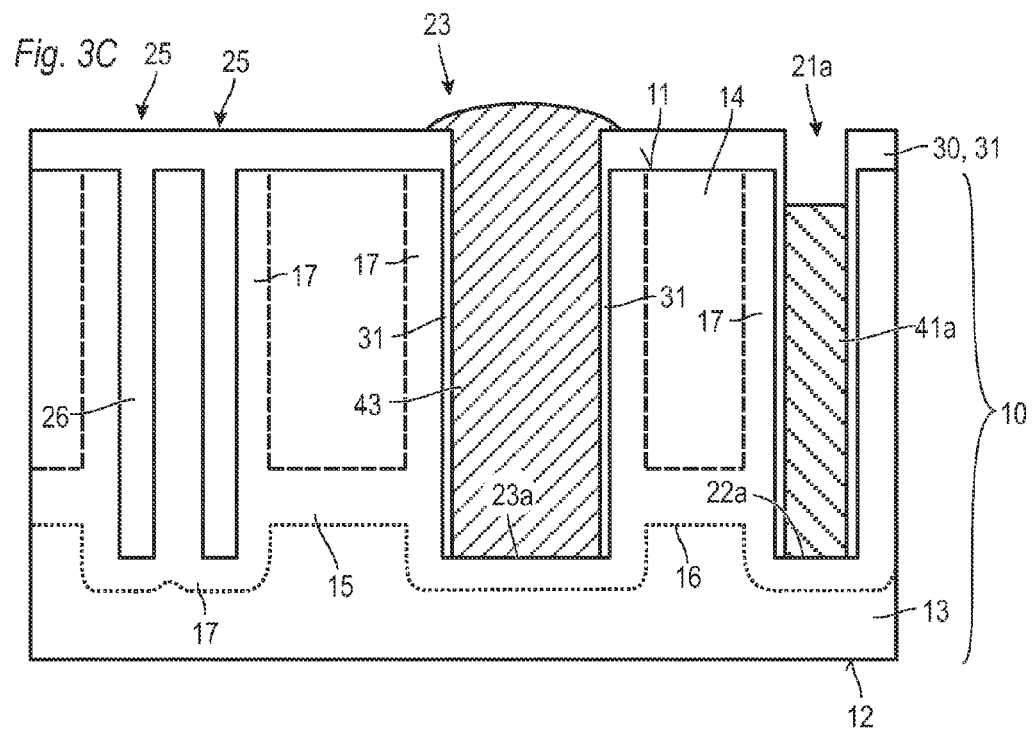
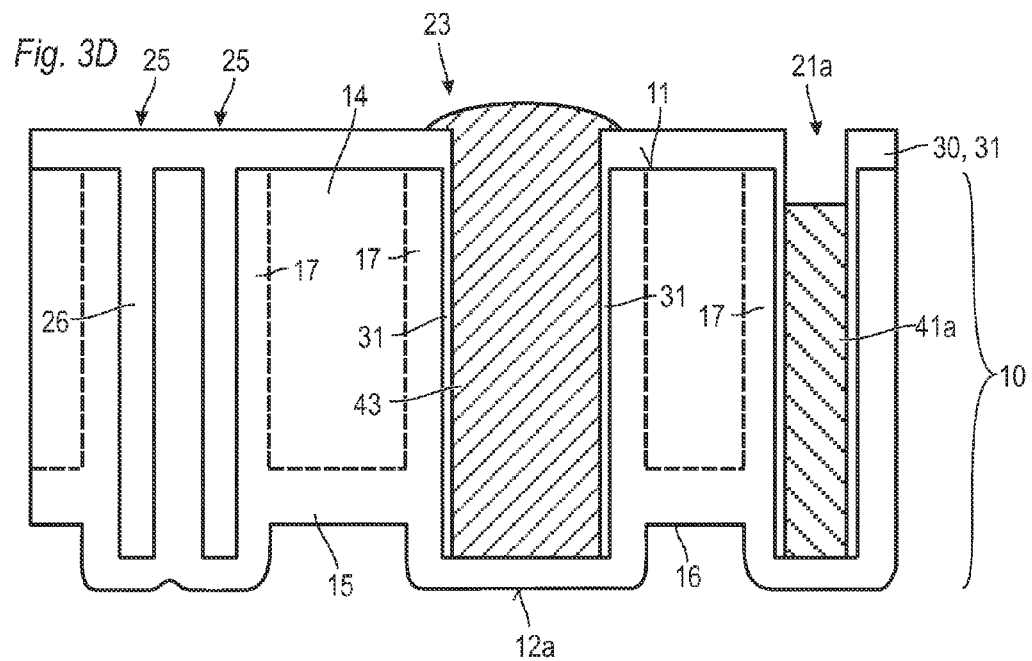

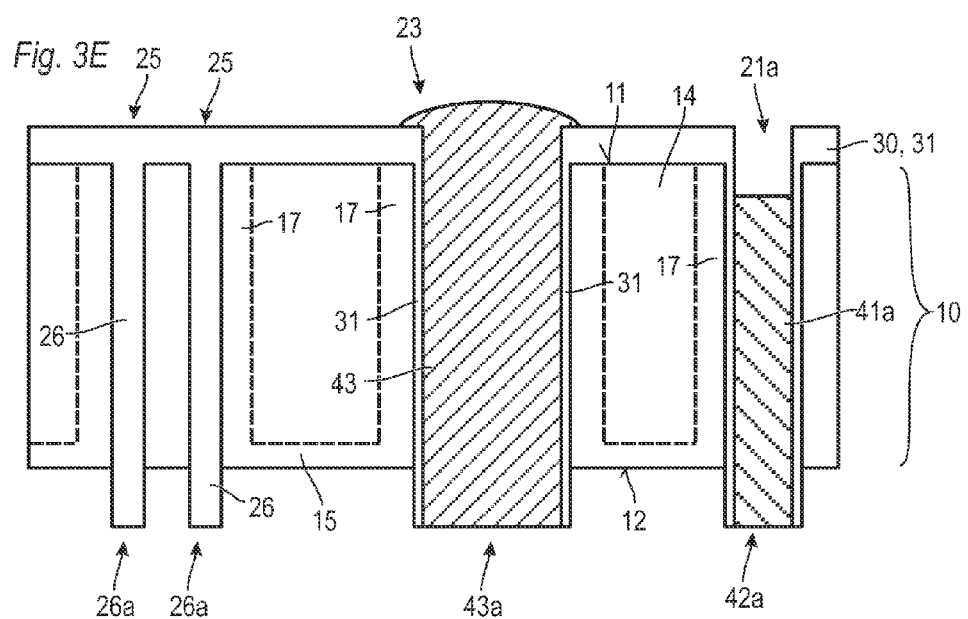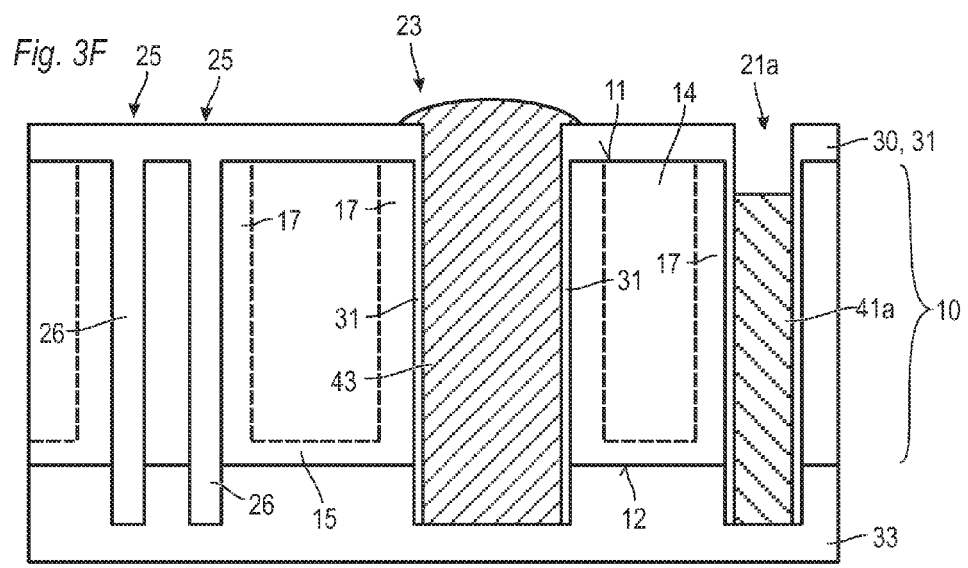

INTEGRATED INDUCTOR AND METHOD FOR MANUFACTURING AN INTEGRATED INDUCTOR

FIELD OF THE INVENTION

The embodiments described herein relate to integrated inductors, and particularly integrated transformers having a magnetic or magnetically soft core structure, semiconductor structures having an integrated inductor or an integrated transformer, and methods for integrating an inductor or transformer into a semiconductor structure.

BACKGROUND

Inductors and transformers are used for signal processing such as processing of gate signals for power devices. It is desired to have the inductors or transformers integrated into the device.

Inductors and transformers having a magnetisable core structure are commonly manufactured by thin film technology which includes printing and pasting to build-up such inductive devices on a substrate. Such processes employ high temperatures which limit their application.

For these and other reasons there is a need for the present invention.

SUMMARY

Specific embodiments described herein pertain to, without being limited thereto, inductors having at least one coil surrounding a magnetisable core structure. Other embodiments described herein pertain to, without being limited thereto, transformers having a first and a second coil each surrounding a magnetisable core structure. Further specific embodiments described herein pertain to methods for integrating an inductor or a transformer having a magnetically soft or a magnetisable core structure.

According to one or more embodiments, a method for integrating an inductor into a semiconductor substrate is provided. The method includes providing a semiconductor substrate having a first surface and a second surface and forming at least a first trench and at least two openings in the semiconductor substrate. The first trench and the openings extend from the first surface into the semiconductor substrate, and the first trench has a ring-like shape. A portion of the first trench is arranged between the two openings. The method further includes depositing a magnetically soft material into the first trench to form a ring-like closed magnetisable core structure, depositing a conductive material into the openings to form vias and forming an electrical cross-connection between the vias.

According to one or more embodiments, a method for integrating a transformer into a semiconductor substrate is provided. The method includes providing a semiconductor substrate having a first surface and a second surface. At least a first trench for a magnetisable core structure, first openings for a first coil surrounding a first portion of the magnetisable core structure and second openings for a second coil surrounding a second portion of the magnetisable core structure are formed in the semiconductor substrate. The first trench and the first and second openings extend from the first surface of the semiconductor substrate into the semiconductor substrate, and the first trench has a ring-like course or shape. The first openings are arranged next to a first portion of the first trench and the second openings are arranged next to a second portion of the first trench. The method further includes depositing a magnetically soft material into the first trench to form a ring-like closed magnetisable core structure and depositing a conductive material into the first and second openings to form first and second vias. The second surface of the semiconductor substrate is processed to expose a portion of the magnetisable core structure and end portions of the first and second vias. An insulating layer is formed on the processed second surface, and electrical cross-connections are formed on the insulating layer, each of the electrical cross-connections electrically connecting a pair of respective vias.

According to one or more embodiments, a method for integrating a transformer into a semiconductor structure is provided. The method includes providing a semiconductor substrate having a first surface and a second surface, etching at least an inner ring-like trench and an outer ring-like trench surrounding the inner trench into the first surface of the semiconductor substrate up to a given depth, the inner trench is spaced apart from the outer trench, and etching a plurality of openings into the semiconductor substrate to a given depth. The method further includes depositing a magnetically soft material into the inner trench and the outer trench to form a ring-like closed magnetisable core structure having at least two ring-like core members insulated from each other, depositing a conductive material into the plurality of openings to form vias, processing the second surface of the semiconductor substrate to expose end portions of the vias, forming an insulating layer on the processed second surface, and forming electrical cross-connections on the insulating layer, each of the electrical cross-connections electrically connecting a pair of respective vias.

According to one or more embodiments, a semiconductor structure is provided. The semiconductor structure includes a semiconductor substrate having a first surface and a second surface. The semiconductor structure further includes a magnetisable core structure having at least a first trench extending from the first surface into the semiconductor substrate, the first trench being filled with a magnetically soft material and forming a first closed ring-like structure. At least a first coil surrounds a first portion of the magnetisable core structure, the first coil having at least two conductive vias extending from the first surface to the second surface of the semiconductor substrate. An electrical cross-connection is formed between the two vias at the second surface of the semiconductor substrate, the electrical cross-connection crossing the first portion of the magnetisable core structure. The first portion of the magnetisable core structure is arranged between the vias.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 2A to 2F illustrate processes of a method for manufacturing an integrated transformer according to one embodiment.

FIGS. 3A to 3F illustrate processes of a method for manufacturing an integrated transformer according to one embodiment.

DETAILED DESCRIPTION

Figure 1:
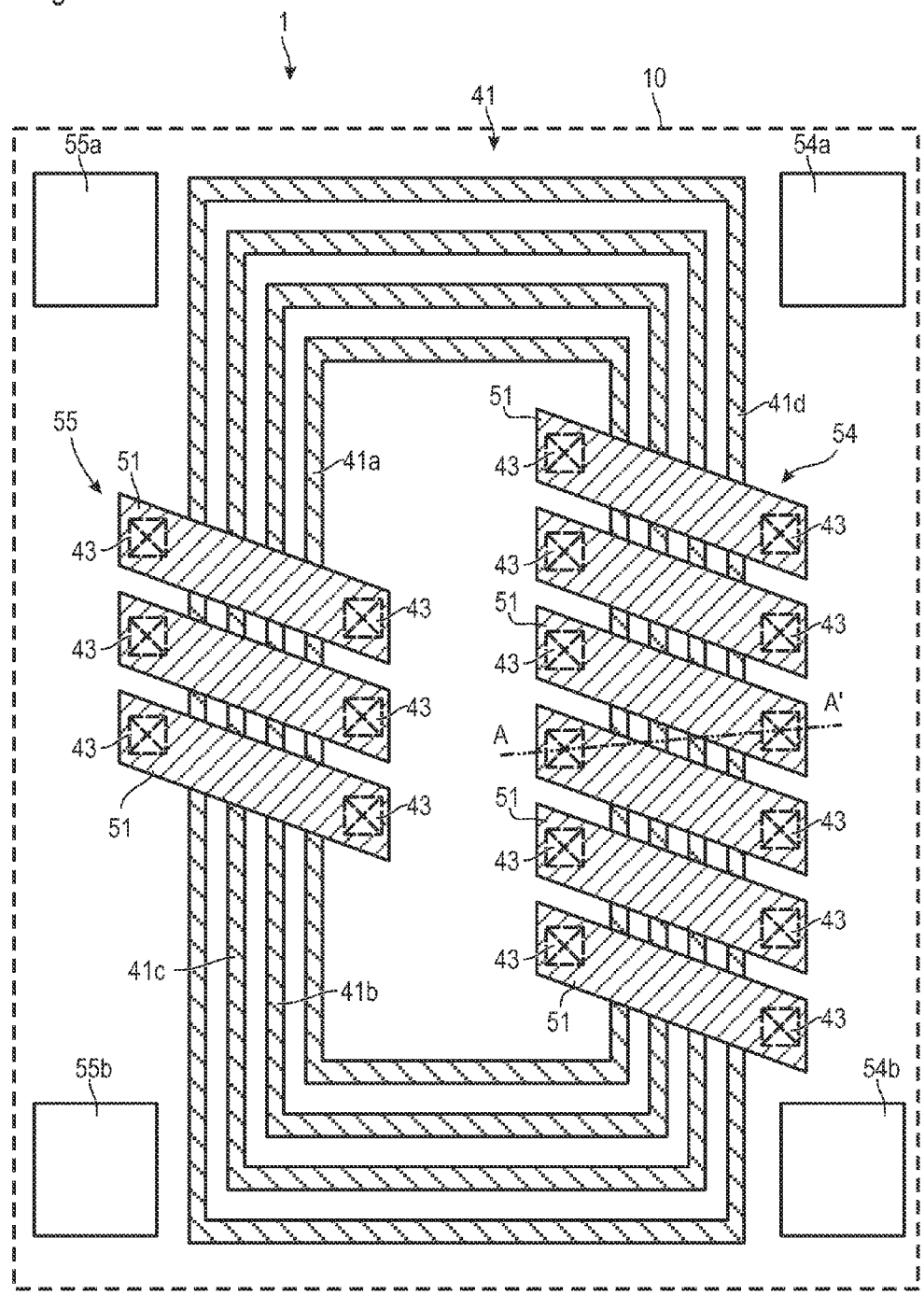
FIG. 1 illustrates a plan view onto an integrated transformer according to one embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description include such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

The terms "magnetically soft core" and "magnetic core" and "magnetisable core structure" intend to describe structures formed by a "magnetically soft" material which can be easily magnetized and re-magnetized upon applying of an external magnetic field. Examples of magnetically soft materials are unalloyed iron, nickel-iron alloys and cobalt-iron alloys. Such materials do not remain magnetised, or only weakly magnetised, when the field is removed unlike "magnetically hard" materials.

When referring to semiconductor devices, at least two-terminal devices are meant, an example is a diode. Semiconductor devices can also be three-terminal devices such as a field-effect transistor (FET), insulated gate bipolar transistor (IGBT), junction field effect transistors (JFET), and thyristors to name few. The semiconductor devices can also include more than three terminals. According to an embodiment, semiconductor devices are power devices. Integrated circuits include a plurality of integrated devices.

FIG. 1 illustrates a first embodiment of a semiconductor structure having an integrated transformer. The semiconductor structure 1 includes a semiconductor substrate 10, a portion of which is illustrated in FIG. 1. FIG. 1 is a plan view of a first side or surface of the semiconductor substrate 10.

The semiconductor structure 1 includes a magnetic core structure 41 which has in this embodiment four magnetic core members 41a to 41d. Each of the magnetic core members 41a to 41d has a ring-like shape and forms a closed magnetic ring structure. In the present embodiment, the magnetic core members 41a to 41d have a rectangular shape but can also have a circular, elliptic, quadratic or any other ring-like shape when seen in plan view from the first side of the semiconductor substrate 10.

The magnetic core structure 41 includes at least an inner core member 41a and an outer core member 41d which laterally surrounds the inner core member 41a when seen in the plan view from the first side of the semiconductor substrate 10. According to an embodiment, the magnetic core structure 41 includes two, three, four or more magnetic core members each forming a "laminate" or "transformer sheet" of the magnetic core structure 41. The core members 41a to 41d are electrically insulated from each other as described further below to avoid formation of eddy currents.

The core members 41a to 41d are integrated into the semiconductor substrate 10, wherein each core member 41a to 41d is arranged in a separate trench formed in the semiconductor substrate 10. Each trench is filled partially or completely with a magnetically soft material suitable for forming a transformer core.

The transformer further includes a first coil 54 and a second coil 55. First coil 54 surrounds a first portion of the magnetic core structure 41. Second coil 55 surrounds a second portion of the magnetic core structure 41. Each coil includes a plurality of vias 43. A first group of vias 43 is arranged next to the first portion while a second group of vias 43 is arranged next to the second portion of the magnetic core structure 41. The vias 43 of a respective group are arranged on both sides of the respective portion of the magnetic core structure 41. First coil 54 and second coil 55 are spiral coils in this embodiment which coil around the respective portions of the core structure 41.

The coils 54, 55 also include electrical cross-connections 51. Each cross-connection 51 electrically connects two vias 43 of a group arranged next to a portion of the magnetic core structure 41, with one of the two vias 43 being arranged on one side of that portion while the other one of the two vias 43 being arranged on the other side of that port on. FIG. 1 illustrates first electrical cross-connections 51 which are formed on the first surface or side of the semiconductor substrate 10. Second electrical cross-connections are formed on the second side or surface of the semiconductor substrate 10 and therefore are out of view in FIG. 1. The first electrical cross-connections 51 run in FIG. 1 in a slanted manner to connect two vias 43 which are displaced to each other with respect to a lateral direction of FIG. 1. The second electrical cross-connections extend in an orientation substantially parallel to line AA' to connect one via 43 of a pair of vias connected by a first electrical cross-connection 51 with a via 43 of another pair of vias connect by a further first electrical cross-connection 51. Hence, each of the first and second coils 54, 55 includes at least one winding, wherein each winding is formed by a pair of vias and at least a first electrical cross-connection 51 arranged on the first side of the semiconductor substrate 10 and a second electrical cross-connection arranged on the second side of the semiconductor substrate 10.

A skilled person will appreciate that the arrangement of the vias and cross-connections can be selected according to specific needs and is not limited to the arrangements illustrated in FIG. 1.

In the embodiment illustrated in FIG. 1, first coil 54 includes five windings while second coil 55 includes 3 windings. A skilled person will appreciate that the number of respective windings is not restricted thereto and can be selected according to specific needs, particularly in view of a desired transformer ratio.

Pads 54a and 54b are provided to connect electrically first coil 54 while pads 55a and 55b are provided to connect electrically second coil 55. When integrating the transformer into a semiconductor structure, the first and/or second coil 54, 55 can also be connected electrically with other integrated devices so that the pads 54a, 54b, 55a, 55b or some of them are not necessarily provided.

The integrated structure can also include an inductor. In this case one of the first and second coils 54, 55 is omitted.

The integrated transformer or inductor exhibits an increased current density with respect to substrate area in comparison to, for example, inductors or transformers formed by thin film technology. As will become apparent from the description further below, the inductors and transformers can be integrated into a semiconductor substrate using only moderate processing temperatures so that the employed processes do not significantly affect semiconductor devices or elements which have already been integrated into the semiconductor substrate. The integrated transformers or inductors exhibit a comparably high quality due to the magnetic core structure.

The increased current density with respect to surface area is obtainable by providing the core members 41a to 41d in deep trenches which extend from the first surface to the second surface of the semiconductor substrate 10. Such trenches, when seen in a cross-sectional view, can be made comparably thin and deep. This reduces the space needed for forming the magnetic or magnetisable core structure 41.

The transformer or inductor having such a magnetically soft core structure 41 is particularly suitable for transmitting control signals to the gates of power devices or power modules. Therefore, the semiconductor structure can include at least one power device and an inductor or/and transformer, each of which are integrated into the same semiconductor substrate 10. The semiconductor structure can include only the transformer or the inductor if a separate device is desired.

With reference to FIGS. 2A to 2F, a first embodiment of a method for integrating a transformer is described. FIGS. 2A to 2F illustrate a cross-sectional view along line AN in FIG. 1.

According to an embodiment, a plurality of deep trenches is formed in a semiconductor substrate. The deep trenches are ring-like closed when seen from the main or first surface of the semiconductor substrate. The trenches run parallel to each other to form a multi-trench structure. The trenches are filled with a magnetically soft material, e.g. by an electrolytic deposition to form a multi-laminate core structure. Vias are formed adjacent to the core structure for providing windings of one or more coils, for example by etching openings and filling them with a conductive material such as copper. The openings and trenches can be formed at the same time. The vias are connected to each other by cross-connections formed at both sides of the semiconductor substrate to complete the windings.

The deep trenches form vertically orientated core laminates or members of the ring-like core structure. The laminates or core members are typically insulated from each other by insulating layers. The spacing between adjacent core members or laminates can be made small to increase integration density and quality of the transformer and inductor, respectively.

In more detail, a semiconductor substrate 10 having a first surface 11 and a second surface 12 arranged opposite to the first surface 11 is provided. The semiconductor substrate 10 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon (SixC1-x) and SiGe heterojunction semiconductor material. For power semiconductor applications currently mainly Si, SiC and GaN materials are used. In the present embodiment, silicon is used as semiconductor material without being limited thereto.

The semiconductor substrate 10 can include a first doping area 14 and a second doping area 13. First doping area 14 is of a first conductivity type which is n-type in this embodiment. Second doping area 13 is of a second conductivity type which is p-type in this embodiment. First and second doping areas 13, 14 form a buried pn-junction 16. A skilled person will appreciate that the doping relations can be reversed.

A mask layer 30 is formed on the first surface 11 of the semiconductor substrate 10. Mask layer 30 can be comprised, for example, of silicon oxide. Other materials are also suitable. Typically, mask layer 30 is a hard mask which will remain on the first surface 11 and will form a portion of an insulating structure. Mask layer 30 includes openings for defining the size and location of trenches and openings which are subsequently formed in the semiconductor substrate 10.

By using an anisotropic etch process, for example a plasma etch process, deep trenches are formed in the semiconductor substrate 10. The trenches extend from the first surface 11 to a given depth. For example, the trenches can extend from the first surface 11 completely through the first doping area 14 and the buried pn-junction 16 and partially into the second doping area 13.

Typically, trenches 21a to 21d disposed in a core region 21 and openings 23 disposed adjacent to the core region 21 are formed using the same etch process. It is also possible to use different etch processes for forming the trenches 21a to 21d and for forming the openings 23. The etching can be a single-step process, a two-step process or a multi-step process.

In the embodiment illustrated here, a first trench 21a, a second trench 21b, a third trench 21c and a fourth trench 21d are formed, with the first trench 21a being an inner trench and each of the other trenches 21b to 21d being an outer trench with respect to the first trench 21a and laterally surrounding first trench 21a. Third trench 21c laterally surrounds second trench 21b while fourth trench 21d laterally surrounds third trench 21c. The lateral "diameter" of the trenches increases from the first trench 21a to the fourth trench 21d.

Each of the trenches 21a to 21d defines a core member while each of the openings 23 defines a via to be formed in subsequent processes. Each of the trenches 21a to 21d has a closed ring-like shape when seen in plan view from the first surface 11 as illustrated in connection with FIG. 1. The trenches 21a to 21d run parallel to each other and are spaced apart from each other by a given distance.

The depth of the trenches 21a to 21d and of the openings 23 can be selected according to specific needs. For example, the trenches 21a to 21d and the openings 23 can have a depth which will be larger than the final thickness of the semiconductor substrate 10 as described further below. Also, the lateral width of the trenches 21a to 21d can be smaller than the lateral width of the openings 23. The reduced lateral thickness of the trenches 21a to 21d avoids eddy currents in the later formed core members. The lateral thickness of the openings 23 is adapted to the current density of the final semiconductor structure. The lateral thickness of the trenches 21a to 21d can be comparably small and can be, for example, between about 0.2 µm and about 2 µm.

Figure 2A:
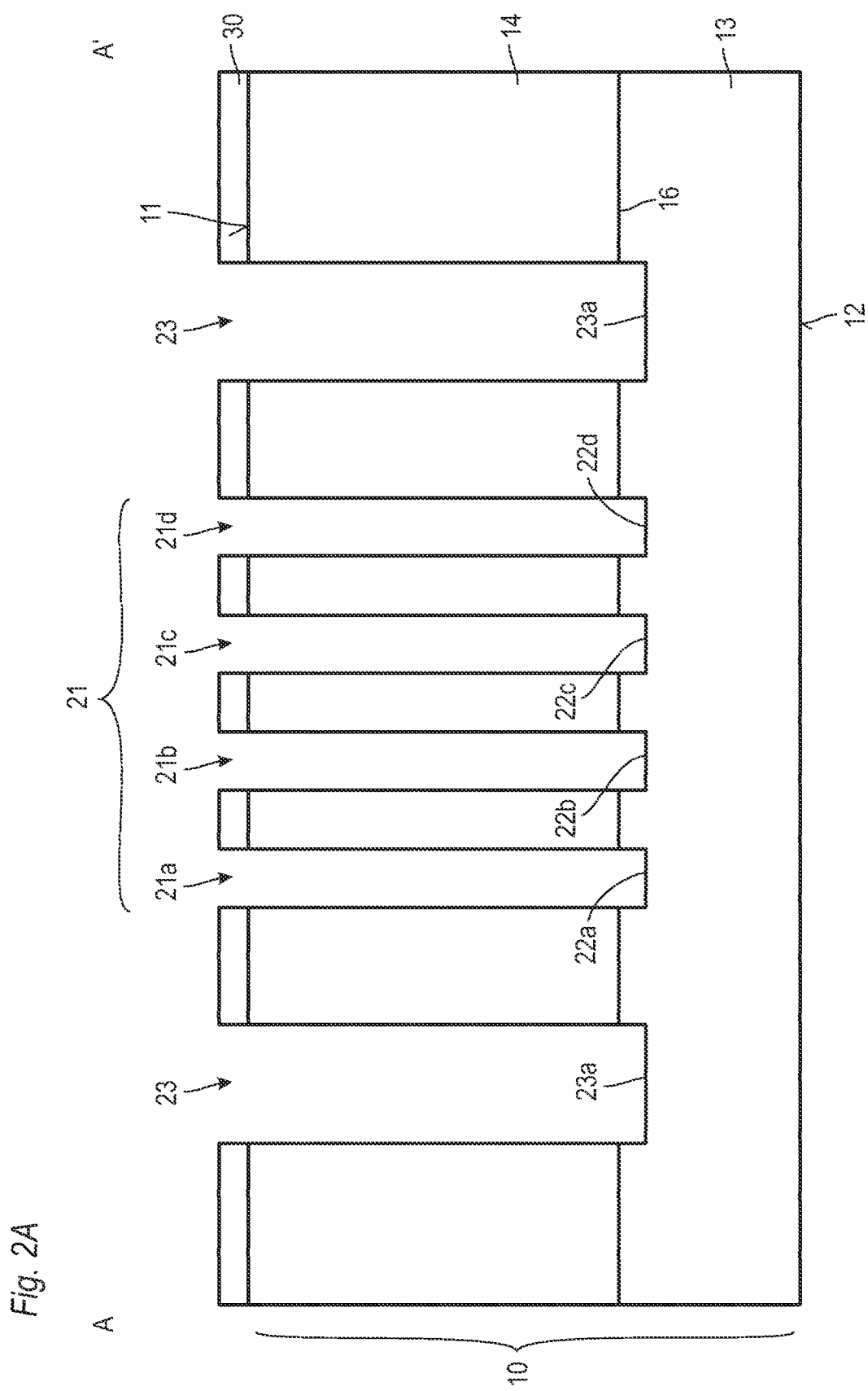
Figure 2B:
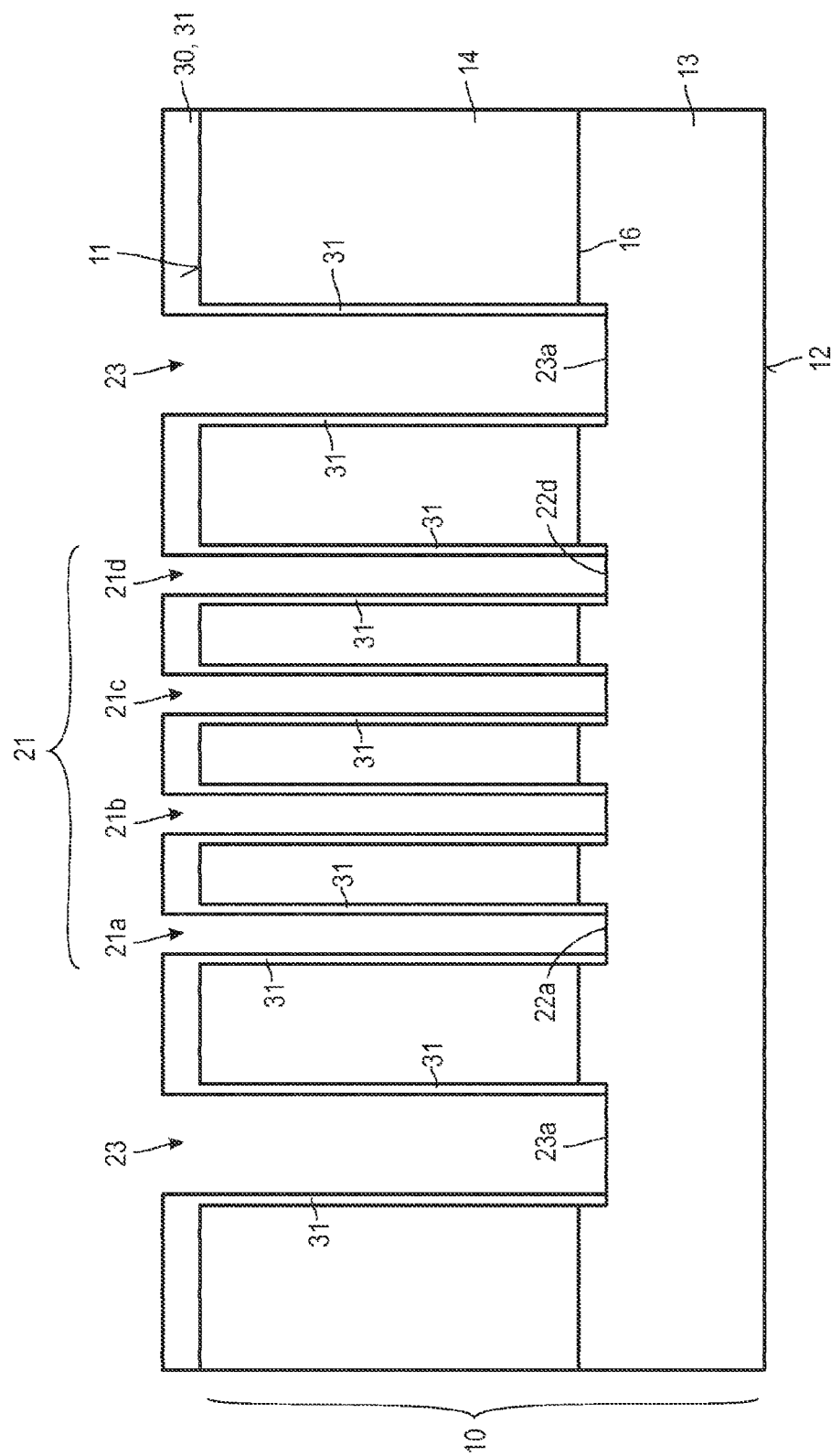

In a further process as illustrated in FIG. 2B, an insulating layer 31 is formed on sidewall portions and bottom portions 22a to 22d and 23a of the trenches 21a to 21d and openings 23, respectively. For example, the exposed sidewall portions and bottom portions 22a to 22d and 23, respectively, can be thermally oxidised to form an oxide layer, typically a silicon oxide layer. Alternatively, an oxide layer can be conformally deposited by CVD.

As illustrated in FIG. 2B, insulating layer 31 is comparably thin with respect to mask layer 30. Formation of the insulating layer 31 also increases the material thickness of mask layer 30, either by depositing additional material or by oxidation of semiconductor material below the mask layer 30. The initial thickness of mask layer 30 is selected such that the total material thickness of mask layer 30 and insulating layer 31 on the first surface 11 of the semiconductor substrate 10 is significantly larger than the thickness of the insulating layer 31 on bottom portions 22a to 22d and 23a, respectively.

In a further process, the insulating layer 31 is anisotropically etched to form insulating spacers 31 arranged on the sidewalls of trenches 21a to 21d and openings 23. The anisotropic etch process removes the insulating layer from bottom portions 22a to 22d and 23 so that these portions are exposed. The resulting structure is illustrated in FIG. 2B.

Figure 2C:
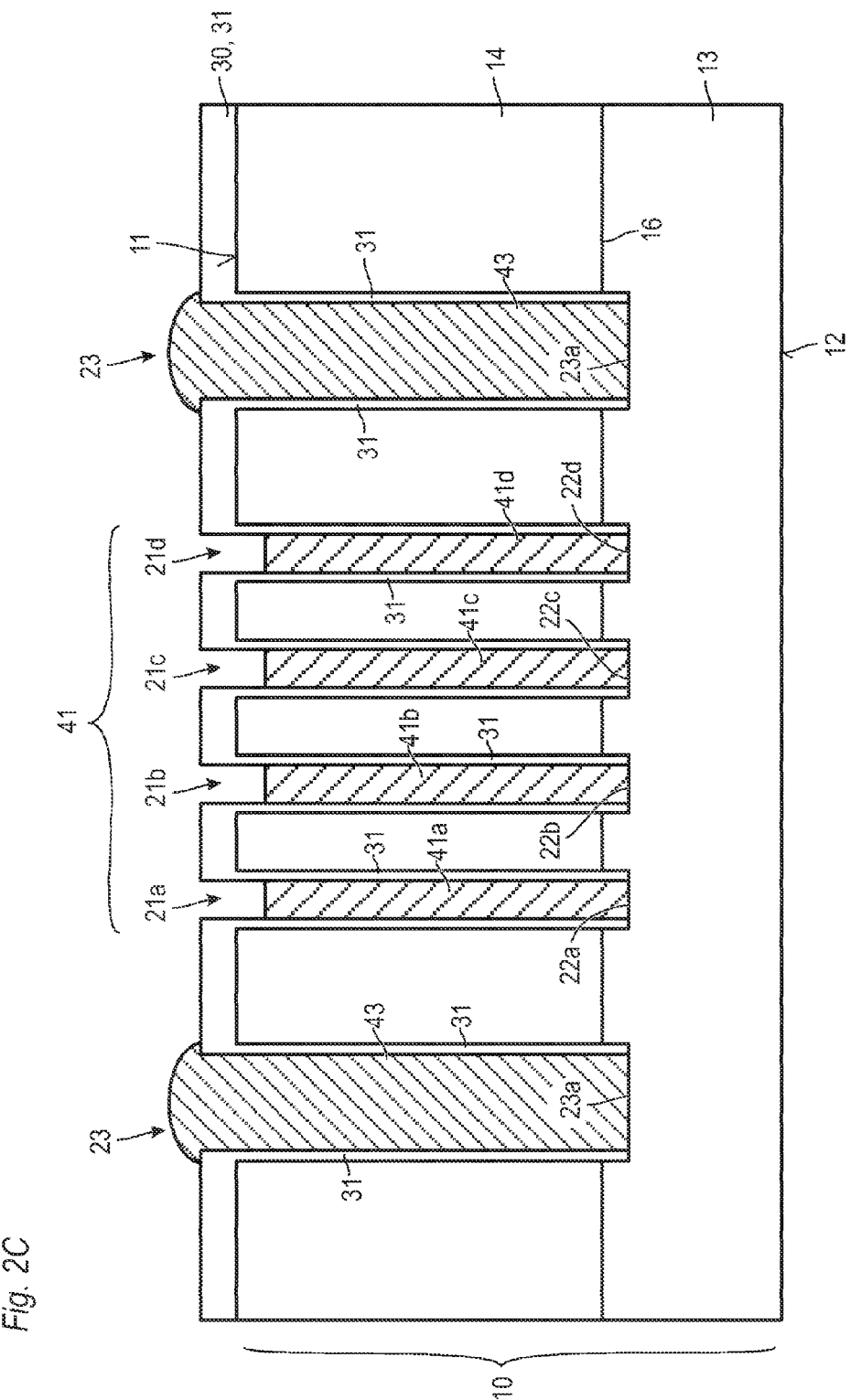

In further processes, a magnetically soft material is deposited in the trenches 21a to 21d while a highly conductive material is deposited in the openings 23 as illustrated in FIG. 2C. Typically, the material deposited into the trenches 21a to 21d is different to the material deposited into the openings 23. Suitable conductive materials are copper and aluminium, for example.

A magnetically soft material is for example iron which can be electrolytically deposited. For this purpose, the second surface 12 of the semiconductor substrate 10 is electrically connected to a cathode while an anode of an electrolytic cell is placed in an electrolytic plating bath in which a suitable iron salt is dissolved. An example for a plating bath is a solution including iron chloride and calcium chloride. The semiconductor substrate 10 is then immersed into the plating bath. Since the bottom portions 22a to 22d of the trenches 21a to 21d are exposed, iron is deposited onto the bottom portions 22a to 22d and successively fills the trenches 21a to 21d. The deposition can be stopped before the deposited material reaches the first surface 11 to keep the material deposited into the respective trenches insulated from each other. Since the other portions of the semiconductor substrate 10 are covered by mask layer 30, insulating layer 31 and insulating spacers 31, respectively, no deposition occurs on other part of the semiconductor substrate 10. To avoid deposition of iron in the openings 23, an auxiliary material can be used to partially fill openings 23, the auxiliary material being removed after filling trenches 21a to 21d.

Each of the filled trenches 21a to 21d forms a respective magnetically soft core member 41a to 41d which are spaced apart from each other. Insulation between adjacent core members 41a to 41d is provided by mask layer 30, insulating layer 31 and insulating spacers 31, respectively.

An annealing process at moderate temperatures, for example at about 200° C. or less, for tempering the electrochemically deposited iron can then be performed.

After removing the auxiliary material from openings 23, a conductive material such as copper can be deposited for example by CVD or by electrochemical deposition. To avoid deposition of copper into trenches 21a to 21d, a further auxiliary material can be deposited which temporally covers trenches 21a to 21d. Before depositing copper, a barrier layer such as a nickel layer can be formed in the openings 23. The barrier layer prevents outdiffusion of copper. The resulting structure is illustrated in FIG. 2C which shows the openings 23 filled with copper forming vias 43.

Figure 2D:
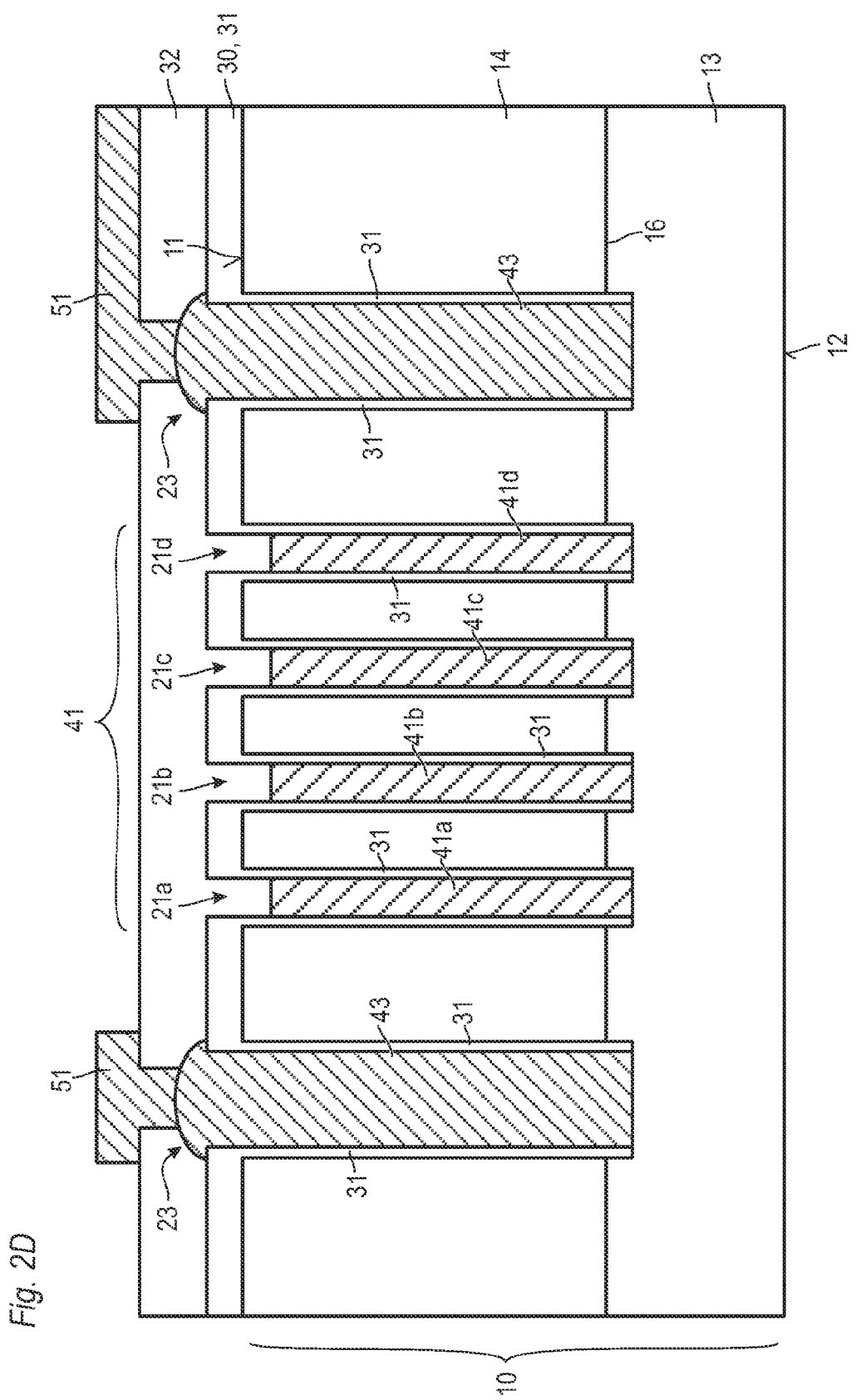

In further processes, as illustrated in FIG. 2D, an insulation layer 32 is deposited on mask layer 30, 31. Openings are formed in the insulation layer 32 to provide access to the vias 43 disposed in the openings 23. In a further process, a first or front-side metallisation 51 is formed on insulation layer 32 which electrically connects the vias 43. First metallisation 51 forms first electrical cross-connections 51 as described with respect to FIG. 1. Portions of first metallisation can also be used for forming pads 54a, 54b, 55a, 55b e.g. as shown in FIG. 1 and for forming a wiring for devices and circuits which have already been integrated into the semiconductor substrate 10 and for forming electrical connections between the transformer and these devices or circuits.

As illustrated in FIG. 2E, a carrier wafer 60 such as a glass wafer, is temporarily or permanently attached to the first side of the semiconductor structure formed here by first metallisation 51 and insulation layer 32. The second surface 12 of the semiconductor substrate 10 is then processed to expose end portions 43a at least of the vias 43. End portions 43a of the vias 43 and end portions 42a to 42d of the core members 41a to 41d are exposed and project from the processed second surface 12a by a given distance.

Processing of the second surface 12 can include etching, for example electrochemical etching as further described in connection with FIGS. 3A to 3F. Other processes are also suitable. Processing of the second surface 12 typically results in removal of second doping area 13. The exposed first doping area 14 forms the processed second surface 12a as illustrated in FIG. 2E.

Figure 2F:
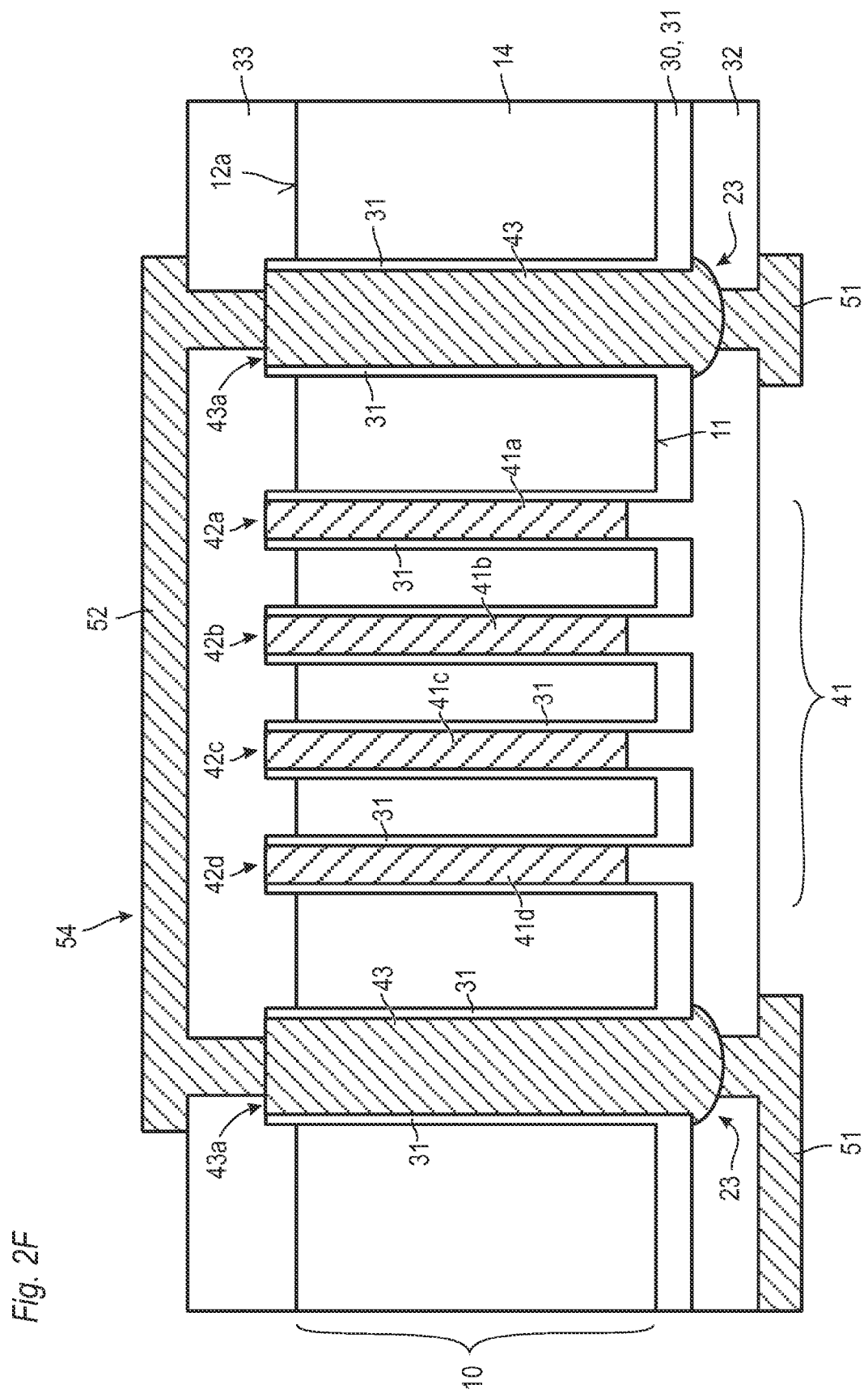

In FIG. 2F the semiconductor substrate 10 is turned upside down so that the first surface 11 is now at the lower portion of the drawings. The carrier wafer 60 can still be attached but is not illustrated here.

In further processes a backside insulation 33 is formed on the processed second surface 12a and a backside or second metallisation 52 is formed on the backside insulation 33 to form electrical cross-connections 52 which electrically connect a first via 43 arranged on one side of a portion of the magnetic or magnetisable core structures 41 with a second via 43 arranged on the opposite side of that portion of the magnetic core structure 41 as described with respect with FIG. 1.

Cross-connections 51 and 52 form together with vias 43 windings of respective coils of the transformer. For example, a photo-structurable epoxy resist can be used to form the backside insulation 33 and to form openings therein to allow access to the end portions 43a of the vias 43. FIG. 2F illustrates a portion of a winding of first coil 24 illustrated in FIG. 1.

Second metallisation 52 can be used in other parts of the semiconductor structure for forming a local wiring for other integrated devices such as power devices or integrated circuits and for providing an electrical connection between the transformer and the other integrated devices.

With respect to FIGS. 3A to 3F a further embodiment will be described which employs an electrochemical etch process of the semiconductor substrate 10 to expose the end portions of the core members 41a to 41d and the vias 43. Same reference numerals are used for corresponding features. To avoid repetition, description of features and processes already described above are omitted or only briefly summarised.

The semiconductor substrate 10 includes a p-doped semiconductor wafer 13 which forms the second doping area. A second surface of the semiconductor wafer 13 forms the second surface 12 of the semiconductor substrate 10. A highly n-doped buried layer 15 is formed at a first surface of the p-doped semiconductor wafer 13. For example a gas phase doping process such as a $POCl_3$ furnace process can be used to dope the semiconductor wafer 13. Other doping processes can be used alternatively. In a further process, an n-doped epitaxial layer 14 is deposited on the buried layer 15. The thickness and doping concentration of the epitaxial layer 14 can be adjusted according to specific needs, particularly in view of the desired blocking voltage of power devices.

A buried pn-junction 16 is formed between the remaining p-doped regions of the semiconductor wafer 13 and the buried layer 15. An $nn^+$-junction 19 is formed between buried layer 15 and epitaxial layer 14.

In further processes, mask layer 30 is formed on the first surface 11 of the semiconductor substrate 10. The first surface 11 is formed here by the exposed upper surface of the epitaxial layer 14 forming the first doping area as described above.

Figure 3A:
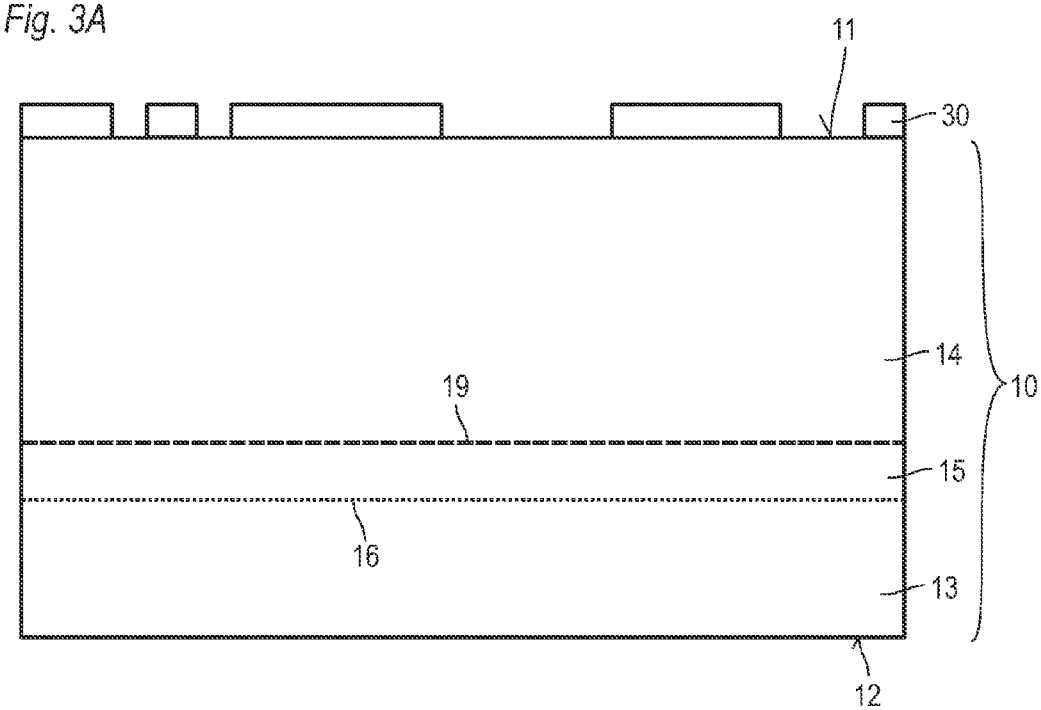
Figure 3B:
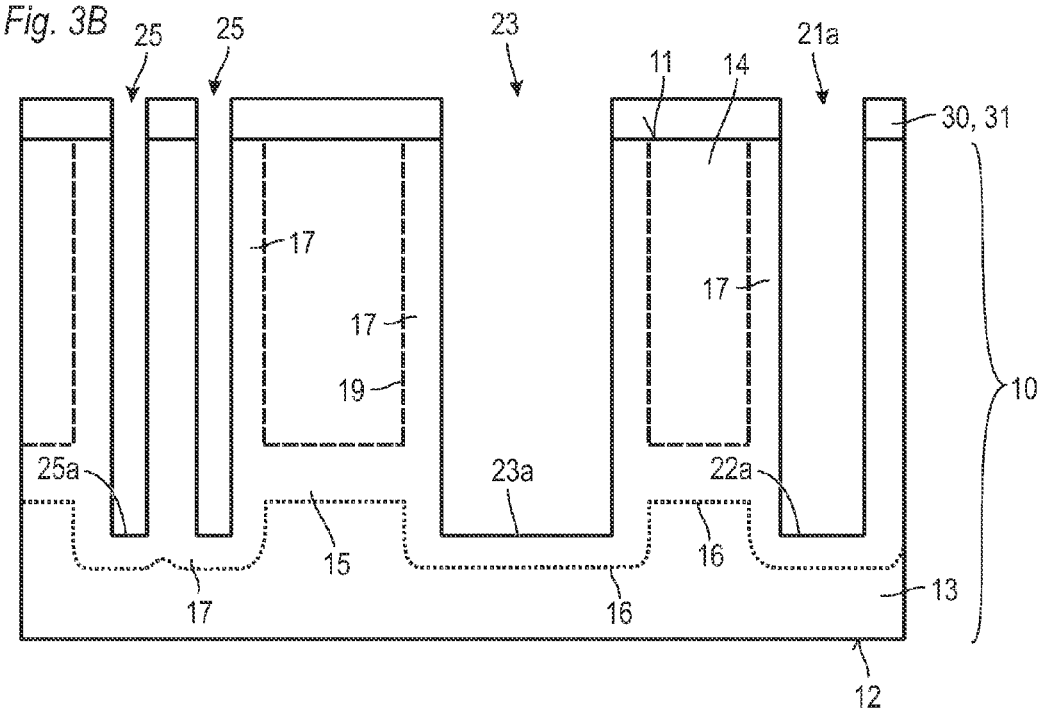

In further processes, as illustrated in FIG. 3B, the trenches 21a to 21d (FIG. 3B illustrates only the first trench 21a) and the openings 23 are etched as described above together with insulation trenches 25. The formed trenches 21a, 25 and openings 23 extend from the first surface 11 completely through the epitaxial layer 14, through the buried layer 15, through pn-junction 16, and into the semiconductor wafer 13 for a given distance which can be selected, for example, by time controlled etching.

Insulation trenches 25 have a smaller lateral thickness than first trench 21a and are later used as device insulation 26. Exposed sidewall and bottom portions of the formed trenches 21a, 25 and openings 43 are doped to form doping regions 17 of the first conductivity type, which is in the present embodiment n-type. For example, a further gas phase doping process such as a $POCL_3$ furnace process can be used to dope the exposed portions of the semiconductor substrate 10. The doping regions 17 form at the bottom portions 22a, 25a and 23a of the trenches 21a, 25 and openings 23, respectively, pn-junctions 16 with p-doped regions of wafer 13. Doping regions 17 form in other areas $nn^+$-junctions with epitaxial layer 14. The pn-junction 16 follows the contour of the bottom portions of the trenches 21a, 25 and openings 23 and is spaced from the trenches and openings by a given distance which can be adjusted by the doping process. The distance can be, for example 1 to 2 µm. The pn-junction 16 is also formed by buried layer 15 and p-region of the semiconductor wafer 13. The pn-junction 16 serves as electrochemical etch stop in a subsequent etch process and allows removal of wafer 13, particularly of the p-doped regions, selectively to the n-doped regions.

Further trenches can be formed for other purposes. For example, openings 23 can be etched in other portions of the semiconductor substrate 10 to form, for example, vias of an internal wiring. Trenches 21a can also be formed, for example, for a further transformer or inductor. Trenches 25 can be formed, for example, for lateral insulation between adjacent devices when desired.

Trenches 25 are comparably thin to ensure that they will be completely filled with insulating material deposited or formed in a subsequent process. When the lateral thickness of a trench 25 is not sufficient for insulating purposes, two or more trenches 25 can be formed adjacent to each other which together form, when filled with an insulating material, a lateral device insulation. FIG. 3B illustrates formation of two adjacent trenches 25 forming together a lateral device insulation 26. It is also possible to integrate the insulation trenches 25 between the coils of the transformer to improve insulation of the coils. It is also possible to form the insulation trenches 25 between the windings of the same coil to improve insulation when needed. For example, each of the openings 23 used for forming vias for the coils can be surrounded by an insulation trench 25.

The thickness of the respective trenches 21a, 25 and openings 23 is selected according to specific needs as described above.

In further processes, as illustrated in FIG. 3C, insulating layer 31 is deposited and back etched to form insulating spacers 31 as described above. Since trenches 25 are comparably thin, these trenches are completely filled with the material of insulating layer 31. Anisotropic back etching of insulating layer 31 therefore does not lead to the formation of spacers and particularly does not expose bottom portions of trenches 25. Trenches 25 remain filled with the material of the insulating layer 31 and form lateral device insulations 26. Then vias 43 and core members 41a are formed as described above. The lateral thickness of insulation trenches 25 can be equal to or less than 2-times the thickness of the insulating layer 31 in some embodiments.

In further processes, wafer 13, particularly the remaining p-doped region of wafer 13, is removed using the pn-junction 16 as an etch stop. Semiconductor wafer 13 can be etched, for example, by electrochemical etching with the n-doped regions 15, 17 and 14 of the semiconductor substrate 14 connected to the anode of an electrochemical etch cell. P-doped regions of the semiconductor wafer 13 are in contact with the alkaline electrolyte of the electrochemical etch cell. The electrolyte is in contact with an inert cathode. The semiconductor substrate 10 is immersed into the electrolyte. A voltage is applied between anode and cathode. The alkaline electrolyte etches the p-doped material as long as the electrolyte has not yet reached the pn-junction. Before reaching the pn-junction, the voltage applied between anode and cathode mainly drops over the pn-junction. When the etching has progressed so that the electrolyte reaches the pn-junction, the voltage drops over the electrolyte and electrochemical oxidation occurs which prevents the electrolyte from further etching the semiconductor substrate. Hence, the etching stops. The resulting structure of this selective etching process, which stops at the pn-junction, and particularly at the edge of the space charge region of the pn-junction, is illustrated in FIG. 3D.

Subsequently, a time-controlled etch process is performed to remove remaining semiconductor material at the second surface 12 and to expose end portion 42a of the first trench 21a, end portion 43a of opening 43, and end portion 26a of lateral device insulations 26. The respective end portions project from the processed second surface 12a of the semiconductor substrate 10 by a given distance which can be adjusted by selecting the etching time of the time-controlled etch process. This etch process partially removes buried layer 15. The resulting structure is illustrated in FIG. 3E.

In FIG. 3F, backside insulation 33 is formed as described above. Further processes can be used to finalise the transformer as described above.

Figure 4:
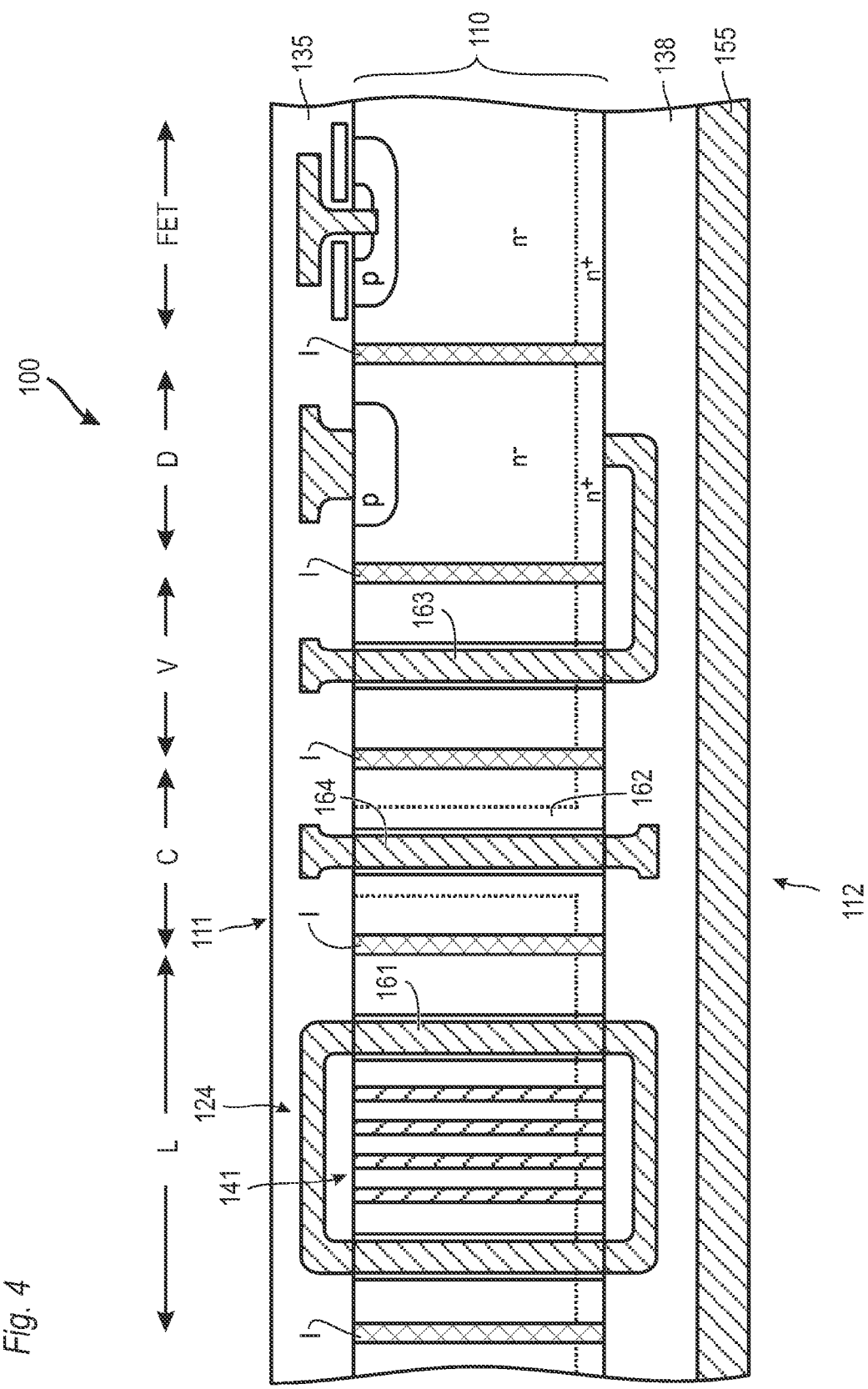
FIG. 4 illustrates a semiconductor structure with an integrated transformer according to one embodiment.

FIG. 4 illustrates a cross-sectional view of semiconductor structure 100 having a plurality of devices and elements integrated into the same semiconductor substrate 110. An inductor or transformer 124 including its magnetisable core structure 141 is integrated in the left portion of the semiconductor device. The region occupied by the inductor or transformer is denoted by "L". Transformer or inductor 124 has a high quality due to the magnetically soft core structure 141 which includes a plurality of sheet-like core members each being integrated into a respective trench of the semiconductor substrate. Inductor 124 includes vias 161 which can be formed as described above in connection with vias 43.

A capacitor region "C" includes a capacitor having an inner electrode 164 which is formed in a similar manner as the vias 43 described above. Electrode 164 can have, however, the shape of a plate to increase the capacitance. The other electrode is formed by the semiconductor substrate 110, particularly by highly n-doped regions 162 formed along the sidewalls of the etched trench as described above. Inner electrode 164 can be formed together with vias 161. Insulating layer 31 formed as described above can be used as capacitor dielectric. Alternatively, other insulating materials can be deposited on the trench sidewalls to form the capacitor dielectric.

A via region "V" can also be integrated which is used to provide an electrical through-connection from the first side 111 to the second side 112 of the semiconductor substrate 100. Via region V can include one or more vias 163 which can be a part of a local wiring. Vias 163 can be formed together with inner electrode 164 and vias 161 of inductor 124.

Furthermore, semiconductor devices such as diodes or field effect transistors can also be integrated into the semiconductor structure 100. "D" denotes a diode region while "FET" denotes a transistor region. Generally, any type of unipolar or bipolar device or devices can be integrated to form integrated circuits or modules such as power modules.

Lateral insulation between adjacent devices can be provided by small trenches "I" filled with insulating material as described above in connection with the formation of lateral device insulation 26.

FIG. 4 illustrates highly n-doped regions adjacent to inner electrode 164. Such doped regions are also typically formed along other trench structures as described above. Furthermore, a highly n-dope region is arranged at the second side 112 of the semiconductor substrate 110 and is a portion of the initial buried layer 15.

An insulation layer 135 is formed at the first side 111 of the semiconductor structure 100 and embeds a local metallisation such as the first metallisation 51 described above. At the second side 112 of the semiconductor structure 100 a further insulation layer 138 can be formed to embed a local metallisation such as second metallisation 52 described above. Insulation layer 138 can be, for example, an epoxy resist which can be spin-coated. On Insulation layer 138 a metal plate or sheet 155, for example a copper plate, can be placed. Metal plate 155 improves thermal dissipation of the semiconductor structure 100. For example, liquid epoxy resist is brought onto the second side of semiconductor substrate 110, then metal plate 155 is placed thereon, and then the semiconductor substrate 110 is spun while keeping the metal plate 155 in close and well defined spaced relation thereto to force the epoxy resist 138 to fill the space between the metal plate 155 and the semiconductor substrate 110. By so doing, a comparably thin insulation layer 138 can be formed which improves heat dissipation from the semiconductor substrate 110 to the metal plate 155.

Figure 5:
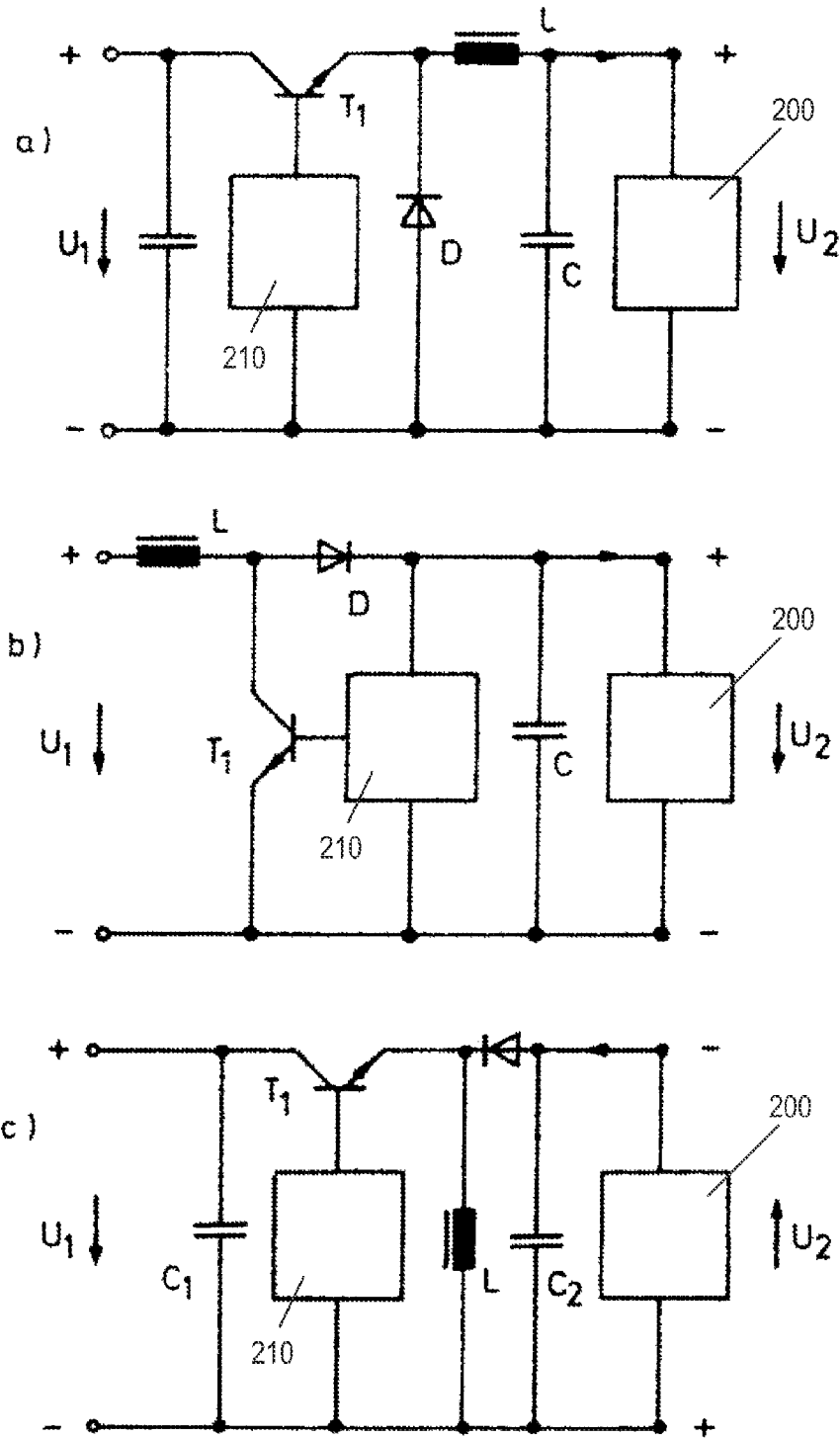
FIG. 5 illustrates integrated circuits according to several embodiments.

FIG. 5 illustrates several embodiments of integrated circuits with an integrated inductor "L". FIG. 5a illustrates a Buck-converter, FIG. 5b illustrates a Boost-Converter, and FIG. 5c illustrates a Buck-Boost-converter. Reference numeral 200 denotes a load while reference numeral 210 denotes control circuits of the respective converters. Such circuits benefit from the high-quality inductors integrated as described herein.

Terms such as "first", "second", and the like, are used to describe various elements, regions, sections, etc. and not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for integrating an inductor in a semiconductor substrate, comprising:
   providing a semiconductor substrate having a first surface and a second surface;
   forming at least a first trench and at least two openings in the semiconductor substrate, the first trench and the at least two openings extending from the first surface into the semiconductor substrate, the first trench having a ring-like shape, a portion of the first trench being arranged between the at least two openings;
   depositing a magnetically soft material into the first trench to form a ring-like closed magnetisable core structure;
   depositing a conductive material into the at least two openings to form vias; and
   forming an electrical cross-connection between the vias.

2. The method according to claim 1, further comprising:
   forming insulating spacers on sidewalls of the first trench and the at least two openings before depositing the respective materials into the first trench and the at least two openings.

3. The method according to claim 1, wherein the magnetically soft material is electrolytically deposited to form the core structure.

4. The method according to claim 1, wherein the conductive material is electrolytically deposited to form the vias.

5. The method according to claim 1, further comprising:
   processing the second surface of the semiconductor substrate to expose end portions at least of the vias; and
   forming the electrical cross-connection between the vias at the processed second surface.

6. The method according to claim 1, wherein the semiconductor substrate comprises a first doping area of a first conductivity type and a second doping area of a second conductivity type, the first and second doping areas forming a buried pn-junction, the first doping area extending from the first surface of the semiconductor substrate to the pn-junction, the second doping region extending from the second surface of the semiconductor substrate to the pn-junction, the method further comprising:
  anisotropically etching the first trench and the at least two openings such that they extend through the first doping region and partially into the second doping region;
  doping at least bottom portions of the first trench and the at least two openings to form doping regions of the first conductivity type, the doping regions forming pn-junctions with the second doping region; and
  etching the second doping region selectively with respect to the doping regions of the first conductivity type.

7. The method according to claim 2, further comprising:
  forming an insulating layer on sidewall and bottom portions of the first trench and the at least two openings;
  etching the insulating layer anisotropically to remove the insulating layer from the bottom portions to form the insulating spacers.

8. The method according to claim 5, further comprising:
  attaching a carrier wafer to the first side of the semiconductor substrate before processing the second surface of the semiconductor substrate.

9. The method according to claim 6, wherein the second doping region is etched electrochemically using the pn-junctions as etch stop.

10. The method according to claim 6, further comprising:
  performing a further etching to expose end portions of the vias.

11. A semiconductor structure, comprising:
  a semiconductor substrate having a first surface and a second surface;
  a magnetisable core structure comprising at least a first trench extending from the first surface into the semiconductor substrate, the first trench being filled with a magnetically soft material and forming a first closed ring-like structure; and
  at least a first coil surrounding a first portion of the magnetisable core structure, the first coil comprising:
    at least two conductive vias extending from the first surface to the second surface of the semiconductor substrate, and
    at least an electrical cross-connection between the at least two vias at the second surface of the semiconductor substrate,
  wherein the electrical cross-connection crosses the first portion of the magnetisable core structure, wherein the first portion of the magnetisable core structure is arranged between the at least vias.

12. The semiconductor structure according to claim 11, wherein the magnetisable core structure further comprises a second trench extending from the first surface into the semiconductor substrate and forming a second closed ring-like structure, wherein the second trench is filled with a magnetically soft material and runs in sections parallel to the first trench, the first trench and the second trench are spaced apart and electrically insulated from each other.

13. The semiconductor structure according to claim 11, further comprising:
  a second coil surrounding a second portion of the magnetisable core structure, the second coil comprising at least two conductive vias extending from the first surface to the second surface of the semiconductor substrate and an electrical cross-connection between the at least two vias, wherein the electrical cross-connection cross the second portion of the magnetisable core structure, and wherein the second portion of the magnetisable core structure is arranged between the at least two vias.

14. The semiconductor structure according to claim 11, wherein the first coil comprises a plurality of windings, wherein each winding comprises two vias and at least one electrical cross-connection.

15. The semiconductor structure according to claim 11, further comprising:
  at least one semiconductor device integrated in the semiconductor substrate.

16. The semiconductor structure according to claim 11, wherein end portions of the vias project from the second surface of the semiconductor device.

17. The semiconductor device of claim 11, wherein the first trench extends up to the second surface, and wherein a portion of the magnetisable core structure projects from the second surface.

18. The semiconductor structure according to claim 13, wherein the first coil comprises a first number of windings and the second coil comprises a second number of windings different than the first number of windings.

19. The semiconductor structure according to claim 15, wherein the at least one semiconductor device is electrically connected to the first coil.

20. A method for integrating a transformer into a semiconductor substrate, comprising:
  providing a semiconductor substrate having a first surface and a second surface;
  forming at least a first trench for a magnetisable core structure, first openings for a first coil surrounding a first portion of the magnetisable core structure and second openings for a second coil surrounding a second portion of the magnetisable core structure in the semiconductor substrate, the first trench and the first and second openings extending from the first surface of the semiconductor substrate into the semiconductor substrate, the first trench having a ring-like shape, the first openings being arranged next to a first portion of the first trench, the second openings being arranged next to a second portion of the first trench;
  depositing a magnetically soft material into the first trench to form a ring-like closed magnetisable core structure;
  depositing a conductive material into the first and second openings to form first and second vias;
  processing the second surface of the semiconductor substrate to expose a portion of the magnetisable core structure and end portions of the first and second vias;
  forming an insulating layer on the processed second surface; and
  forming electrical cross-connections on the insulating layer, wherein each of the electrical cross-connections electrically connects a pair of respective vias.

21. The method according to claim 20, wherein the magnetically soft material is electrodeposited.

22. The method according to claim 20, wherein providing a semiconductor substrate comprises:
  providing a semiconductor wafer of a second doping type, the semiconductor wafer having a first surface and a second surface; and
  forming an epitaxial semiconductor layer of a first conductivity type on the first surface of the semiconductor wafer, the epitaxial layer forming a buried pn-junction with the semiconductor wafer;

the method further comprising:

anisotropically etching the first trench and the first and second openings into the epitaxial layer such that the first trench and the first and second openings extend through the buried pn-junction into the semiconductor wafer;

doping exposed sidewall and bottom portions of the first trench and the first and second openings to form doping regions of the first conductivity type, the doping regions forming pn-junctions with the semiconductor wafer; and etching of second doping-type regions of the semiconductor wafer using the pn-junctions as an etch stop.

23. A method for integrating a transformer into a semiconductor structure, comprising:

providing a semiconductor substrate having a first surface and a second surface;

etching at least an inner ring-like trench and an outer ring-like trench surrounding the inner trench into the first surface of the semiconductor substrate to a given depth, the inner trench being spaced apart from the outer trench;

etching a plurality of openings into the semiconductor substrate to a given depth;

depositing a magnetically soft material into the inner trench and the outer trench to form a ring-like closed magnetisable core structure comprising at least two ring-like core members insulated from each other;

depositing a conductive material into the plurality of openings to form vias;

processing the second surface of the semiconductor substrate to expose end portions of the vias;

forming an insulating layer on the processed second surface; and forming electrical cross-connections on the insulating layer, wherein each of the electrical cross-connections electrically connects a pair of respective vias.

24. The method according to claim 23, further comprising:

integrating at least one of an unipolar device, a bipolar device, and a capacitor into the semiconductor substrate.

25. The method according to claim 24, further comprising:

etching at least one insulation trench into the semiconductor substrate; and filling the insulation trench with an insulating material.

* * * * *